United States Patent [19]
Meyers

[11] Patent Number: 5,164,955
[45] Date of Patent: Nov. 17, 1992

[54] LASER DIODE WITH VOLUME REFRACTIVE INDEX GRATING

[75] Inventor: Mark M. Meyers, Hamlin, N.Y.

[73] Assignee: Eastman Kodak Company, Rochester, N.Y.

[21] Appl. No.: 716,176

[22] Filed: Jun. 17, 1991

[51] Int. Cl.⁵ .................. H01S 3/08; H01S 3/19
[52] U.S. Cl. ........................ 372/96; 372/50; 372/45
[58] Field of Search .................. 372/96, 45, 50

[56] References Cited

U.S. PATENT DOCUMENTS

| | | | |
|---|---|---|---|
| 4,751,710 | 6/1988 | Yamaguchi et al. | 372/96 |
| 4,843,032 | 6/1989 | Tokuda et al. | 372/96 |
| 4,848,856 | 7/1989 | Sugimura et al. | 372/96 |
| 4,856,017 | 8/1989 | Ungar | 372/96 |
| 4,885,753 | 12/1989 | Okai et al. | 372/96 |
| 4,958,357 | 9/1990 | Kinoshita | 372/96 |

Primary Examiner—Georgia Y. Epps
Attorney, Agent, or Firm—Warren W. Kurz

[57] ABSTRACT

A laser diode comprises an optically active planar waveguide and a volume refractive index grating for providing distributed optical feedback of stimulated radiation to the waveguide. According to the invention, the grating comprises a stack of alternating thin layers each layer being less than 300 nm. thick of two materials having different indices of refraction. At least one side of the stack provides a smooth, planar surface composed of the respective edges of each grating layer. The active waveguide, together with optional cladding and separate-confinement heterostructure (SCH) layers, are epitaxially grown atop the smooth grating surface, whereby the respective planes of such layers are substantially perpendicular to the respective planes of the grating layers. The smooth surface of the grating is advantageous in that it promotes good crystalline growth of the subsequently grown layers of the laser diode structure and reduces the number of non-radiative recombination sites. According to a perferred embodiment, the active waveguide material is a multiple quantum well layer which is comprised of alternating layers of p-$Al_{0.7}Ga_{0.3}As$ and P-$Al_{0.5}Ga_{0.95}As$, and the two grating materials comprise $Al_xGa_{1-x}As$, where x is between about 0.04 and 0.3, and $Al_y Ga_{1-y}As$, where y is between about 0.4 and 0.8.

6 Claims, 4 Drawing Sheets

LASER DIODE WITH VOLUME REFRACTIVE INDEX GRATING

FIELD OF THE INVENTION

The present invention relates to improvements in laser diodes of the type which include an integral diffraction grating. More particularly, it relates to a new grating-containing laser diode structure which, compared with prior art structures, is capable of being produced with higher yields and is capable of substantially lower wavelength emissions.

It is well known in the art to incorporate a diffraction grating in surface-emitting, as well as edge-emitting, laser diode structures. Such gratings provide a variety of functions including distributed optical feedback, wavelength stabilization, wavelength tuning, and optical coupling of the stimulated radiation out of the active medium. See, for example, the respective disclosures of U.S. Pat. Nos. 4,856,017 (Unger); 4,958,357 (Kinoshita); 4,751,710 (Yamaguchi et al); 4,847,856 (Sugimura et al); and the commonly assigned U.S. patent application No. 07/564,930, filed on Aug. 9, 1990 in the name of Mark M. Meyers, entitled "Surface Emitting, Low Threshold (SELTH) Laser Diode" U.S. Pat. No. 5,070,509. In all of the above disclosures, the diffraction grating is in the form of a corrugated relief pattern defined by a series of closely spaced rulings or grooves formed in the surface of a cladding or separate-confinement-heterostructure (SCH) layer disposed adjacent the "active" (i.e., optical gain-providing) layer of the laser diode structure.

To form the diffraction grating in the above-mentioned laser diode structures, it is common to use photolithographic or e-beam writing techniques to form a mask through which portions of the cladding or SCH layer may be etched away to produce a grating-defining relief pattern. Since the wavelength at which a diffraction pattern most efficiently diffracts radiation is determined by the relationship, $d = m\lambda/2n$, where d is the grating pitch, m is the diffraction order, $\lambda$ is wavelength of the radiation and n is the refractive index in which the radiation is propagating, it is apparent that the shorter the grating pitch, the shorter the wavelength. In the case of an active aluminum-gallium-arsenide layer having a refractive index of about 3.5, a second-order diffraction grating having a pitch of approximately 238 nm is required to efficiently diffract the 830 nm emission line in a direction substantially normal to the active layer (as required in a surface-emitting laser diode). Since it is very difficult, at best, to produce a grating relief pattern having a pitch less than about 200 nm using conventional photolithographic and e-beam techniques, it may be appreciated that the grating pitch can be the limiting factor in achieving emission wavelengths lower than 700 nm, depending on the refractive index of the active medium.

In addition to the difficulty of producing relief-type diffraction gratings having a pitch less than 200 nm, the corrugated nature of such gratings (no matter how fine the pitch) can give rise to a large number of non-radiative recombination sites (i.e., sites where electrons and holes combine without producing a photon). Also, the corrugated structure makes it difficult to achieve good crystalline growth atop the grating surface. Both of these factors have a negative effect on the laser efficiency and, hence, on the yield of lasers produced from a semiconductive wafer (which is diced to produce a multitude of diode lasers).

SUMMARY OF THE INVENTION

In view of the foregoing discussion, an object of this invention is to provide a grating-containing laser diode structure in which the grating itself imposes substantially no limitation on the minimum wavelength of laser emission and on the laser efficiency.

The grating-containing laser diode structure of the invention is characterized by an integral volume refractive index grating comprising a plurality of alternating thin layers of two materials having different indices of refraction. The respective planes of the grating layers are arranged perpendicular to the plane of the active waveguide of the laser diode structure, and the respective thicknesses of the grating layers determine the grating pitch. Preferably, the grating layers have a thickness such as to provide a grating pitch of 300 nm. or less. An edge of each grating layer is substantially co-planar with a corresponding edge of all grating layers, whereby a smooth grating surface is defined upon which other layers of the laser diode structure may be epitaxially grown. According to a preferred embodiment, the active layer of the laser diode structure comprises an aluminum-gallium-arsenide (AlGaAs) compound, and the two grating materials comprise $Al_{(1-x)}Ga_xAs$, where $0.04 \leq x \leq 0.3$, and $Al_{(1-y)}Ga_yAs$, where $0.4 \leq y \leq 0.8$.

Preferably, the thin layers comprising the above-noted diffraction grating are produced by metal organic chemical vapor deposition (MOCVD) techniques, whereby the layer thickness and composition are readily controlled to produce a desired grating pitch and refractive index profile. Since the thin layers comprising the grating can be grown to monolayer thicknesses (e.g. 5-10 nm), the grating pitch provided by such thin layers imposes virtually no limitation on the wavelength of laser emission. Also, since the edges of the grating layers define a smooth, flat surface, the aforementioned non-radiative recombination sites are minimized and epitaxial growth of additional layers atop the grating can be more readily achieved.

The invention and its advantages will be better understood from the ensuing detailed description of the preferred embodiments, reference being made to the accompanying drawings, wherein like reference characters denote like parts.

DESCRIPTION OF PREFERRED EMBODIMENTS

Figure 1:
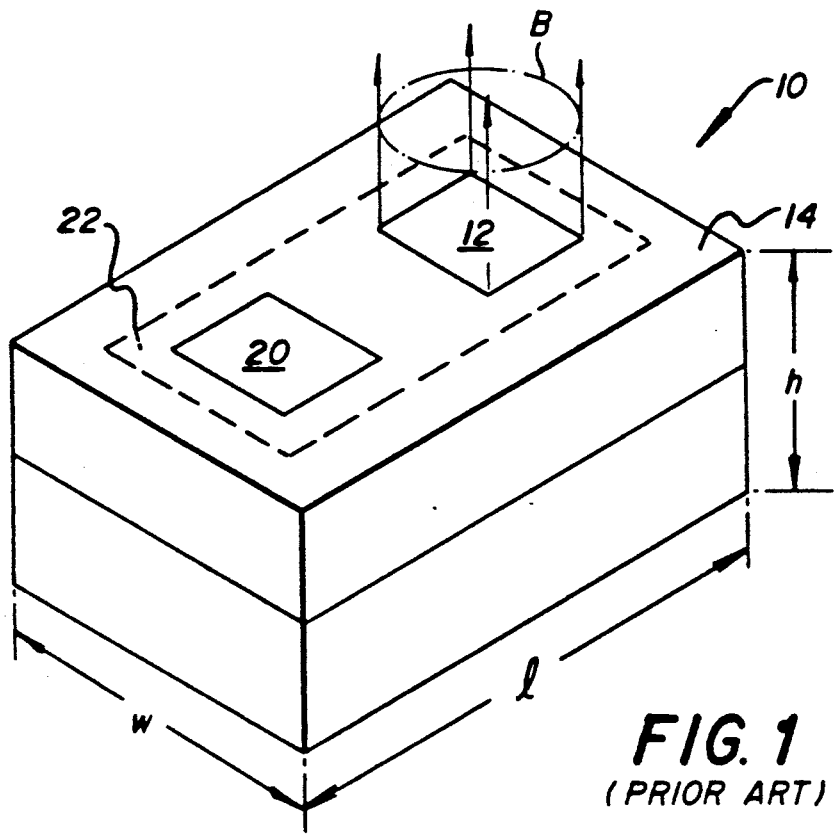
FIGS. 1 and 2 are perspective and cross-sectional illustrations of a surface-emitting, distributive feedback laser diode of the prior art.
Figure 2:
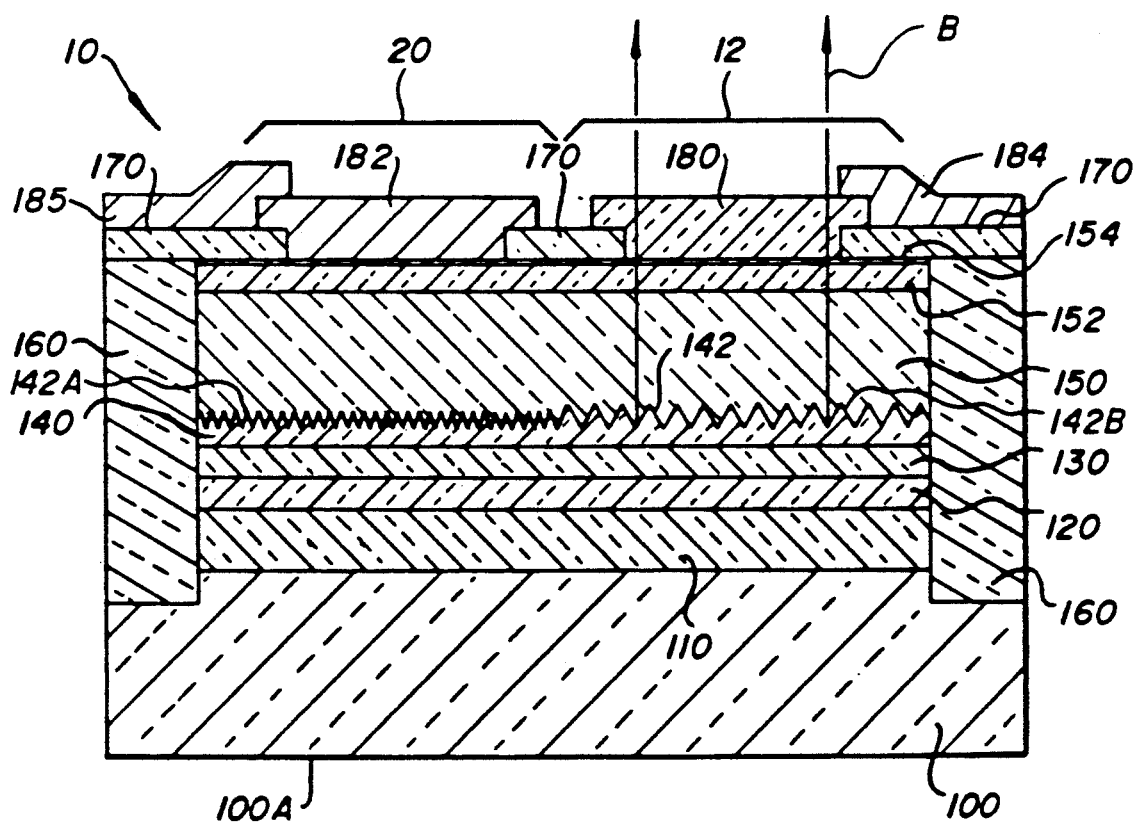

Referring to FIGS. 1 and 2, a surface-emitting, low threshold (SELTH), distributed feedback (DFB) laser diode 10 structured in accordance with the disclosure of the above-mentioned patent application Ser. No. 07/564,930 U.S. Pat. No. 5,070,509 comprises a lasing section 12 which produces a beam B of laser radiation from the upper surface 14 of the laser structure, and a wavelength-tuning section 20 which controls the wavelength of the laser beam. A typical size of such structure is approximately 300 microns in length l, 200 microns in width w, and 150 microns in height h. Such a size is about that of a grain of salt.

Laser 10 is a monolithic structure comprised of a plurality of thin layers or films of various aluminum-gallium-arsenide (AlGaAs) which are successively grown on an n-type gallium-arsenide substrate 100. A cladding layer 110 of, for example, N-type $Al_{0.3}Ga_{0.7}As$ is grown atop substrate 100 to a thickness of about 2 microns, followed by a relatively thin (e.g., 0.2 micron thick) separate-confinement-heterostructure (SCH) layer 120 of, for example, N-type $Al_{0.12}Ga_{0.88}As$. An optically active layer 130 (i.e., a layer in which laser action is achievable) is then grown atop SCH layer 120, followed by another SCH layer 140 of the same material and thickness as layer 120. The composition of the SCH layers is selected so that such layers have a lower index of refraction than the active layer, thereby causing the stimulated laser radiation to propagate within the active layer by waveguide action (i.e., total internal reflection).

Active layer 130 may comprise any one of a variety of suitably doped aluminum-gallium-arsenide compounds. It may be in the form of either a single layer, as shown, or more preferably a plurality (e.g., ten) of thin layers (e.g., 80 Å thick) which act as "quantum wells". The multilayered type of active medium is often preferred due to the lower current levels required to produce laser action and the lower dependence on temperature for the lasing wavelength(s). A suitable material for a single active layer 130 is $Al_{0.04}Ga_{0.96}As$. Suitable materials for a multiple quantum well layer are alternating layers of $p-Al_{0.7}Ga_{0.3}As$, and $P-Al_{0.05}Ga_{0.95}As$.

Upon growing SCH layer 140 atop the active layer, photolithographic techniques are then used to form a diffraction grating 142 in the upper surface of the SCH layer. Such grating has two different pitches, a first order pitch 142A being formed in the tuning section 20 of the laser diode structure, and a coarser, second order pitch 142B being formed in the lasing section 12. The spatial frequency of the second order pitch determines the laser wavelength which is most efficiently coupled out of the active layer 130. Owing to the corrugated structure of the diffraction grating, some of the laser radiation which, by design, is coupled into SCH layer 140 from active layer 130 is diffracted out of the SCH layer to produce the laser beam B.

In addition to the layers mentioned above, laser 10 also includes a second cladding layer 150 formed atop the grating structure 142 and a p-type GaAs layer 152 which facilitates ohmic contact with an electrode structure. Cladding layer 150 may comprise the same material and thickness as cladding layer 110, but being oppositely doped. A silicon dioxide ($SiO_2$) mask 170 is formed atop layer 152, such mask defining two windows for current-injecting electrodes 180 and 182. A thin (e.g., 50 Å) metallic coating 154, such as chromium is vapor deposited atop ohmic contact layer 152, in the window openings before the electrodes are deposited. Electrode 180 is transparent to the beam radiation and may comprise indium-tin-oxide (ITO). Contacts 184 and 185 are provided to wirebond the electrodes 180 and 182, respectively, to current sources. The entire AlGaAs multilayer structure forms a mesa 22 which is surrounded by a burying epitaxial heterostructure 160.

As noted above, the corrugated nature of grating 142 presents certain limitations in terms of low efficiency and relatively long wavelength operation.

Figure 3:
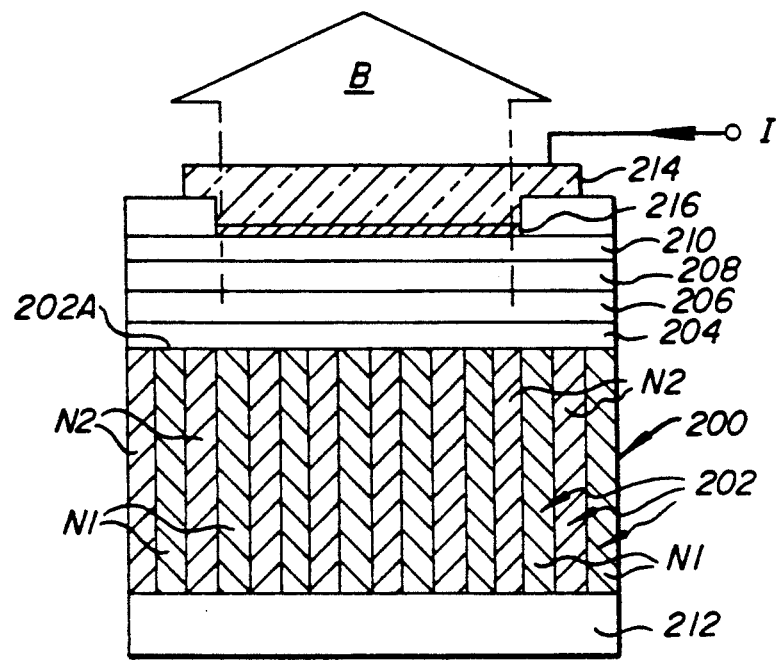
FIG. 3 is a cross-sectional illustration of a surface-emitting, distributive feedback laser diode embodying the present invention.

Now in accordance with the present invention, there is provided a grating-containing laser diode stucture in which the grating element has a smooth surface and can be designed with a pitch much finer than can be provided with conventional relief-type gratings. Referring to FIG. 3, a surface-emitting DFB laser embodying the present invention comprises a volume index grating 200 composed of a multitude of thin layers 202 which alternate in composition between two materials having different indices of refraction, N1 and N2. Preferably, the grating layers are of substantially uniform thickness each being between 5 and 2500 Angstroms thick, and more preferably between 1500 and 2500 Angstroms thick; however, alternate layers may have a thickness which differs from the thickness of those layers disposed therebetween. The thickness of the layers determines the "pitch" of the grating and, if desired, the pitch may be made as fine as a monolayer of molecules, i.e., about ten Angstroms or so. While the stoiciometry of each grating may be uniform, the stoiciometry may vary to provide a desired refractive index profile, as explained in more detail below. At least the respective top edges of grating layers 202, and preferably the respective bottom and side edges as well, are co-planar to define a flat and smooth surface 202A upon which the other crystalline layers of the laser diode structure may be formed. Such other layers may include an SCH layer 204, an active layer 206, a cladding layer 208, and an ohmic contact layer 210.

As is apparent from the drawings, grating layers 202 are disposed on a substrate 212 and extend in a direction perpendicular to the aforementioned other layers. The respective upper edges of the grating layers present a periodic variation in refractive index (due to the different refractive indexes of adjacent layers) to the evanescent portion of a wave propagating in the active layer 206. This refractive index pattern acts, in the same way as a conventional corrugated surface grating, to diffract radiation out of the active layer to produce a laser beam B. Pumping of the active layer to achieve the necessary population inversion therein is achieved by injecting a current into such layer via a transparent electrode 214 which makes contact with the ohmic contact layer 210 via a metal film 216.

As regards materials of layers 204, 206, 208 and 210, the active layer 206 may be of the multiple quantum well (MQW) type, comprising, for example, ten layers of P-type $Al_{0.7}Ga_{0.3}As$, which alternate with ten layers of P-type $Al_{0.05}Ga_{0.95}As$, each layer having a thickness of about 10 nm. The cladding layer 208 may comprise P-type $Al_{0.9}Ga_{0.1}As$, about 10 nm. in thickness, and the SCH layer 204 may comprise N-type $Al_{0.12}Ga_{0.88}As$ with a thickness of about 20 nm. Substrate 212 may comprise $n^+$-type GaAs, and ohmic contact layer 210 may comprise $p^+$-type GaAs. Assuming all of the above layers are made from ALGaAs, preferred grating materials are $Al_xGa_{1-x}As$, where x is between about 0.04 and 0.3, and $Al_yGa_{1-y}As$, where y is between about 0.4 and 0.8. A preferred thickness for each grating layer is 119 nm., which provides the optimum second order diffraction pitch (238 nm.) required to diffract radiation at 830 nm. in a direction perpendicular to the active layer. Of course, the optimum grating layer thickness will depend on the material of the active layer, which determines the wavelength of laser emission.

Figure 4:
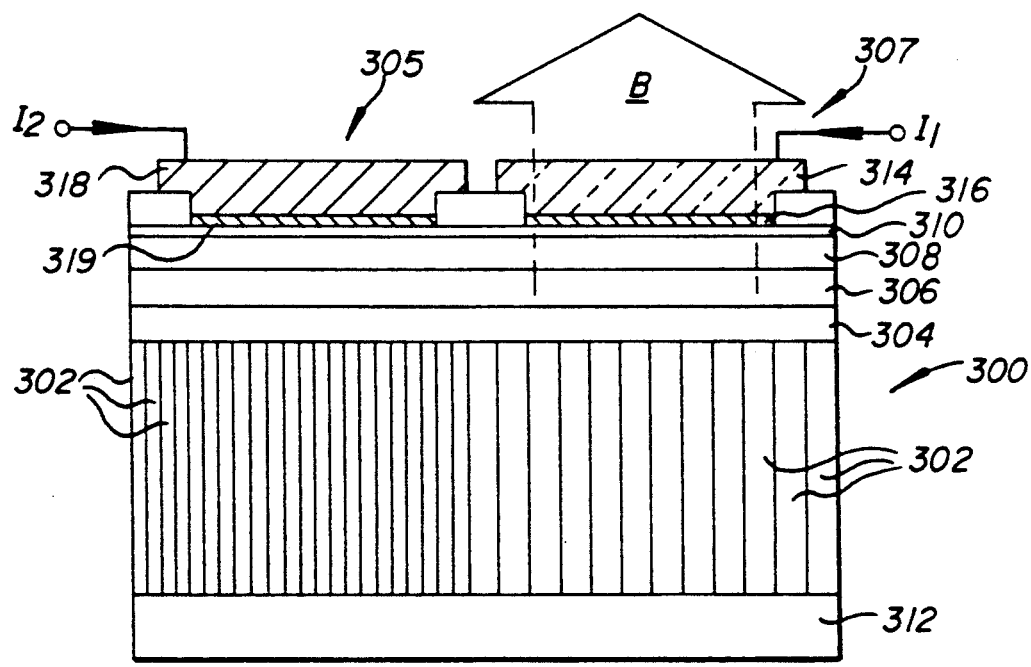
FIG. 4 is a cross-sectional illustration of a wavelength-tunable, surface-emitting, distributed-feedback laser diode embodying the present invention.

In FIG. 4, a wavelength tunable, surface-emitting DFB laser incorporates an integral volume refractive index grating 300 of the type described above. In the wavelength tuning section 305, the respective thicknesses of the grating layers 302 define a first order diffraction grating in the tuning section, and a second-order diffraction grating in the lasing section 307. The grating layers in the tuning section are one-half the thickness of the grating layers in the lasing section. In the case of the above-mentioned aluminum-gallium-arsenide materials, the respective thicknesses of the grating layers in the tuning section are about 120 nm. thereby providing a grating pitch of 238 nm. As in the case of the laser structure shown in FIG. 3, the laser of FIG. 4 includes an SCH layer 304, an active layer 306, a cladding layer 308 and an ohmic contact layer, all made, for example, from the compounds mentioned above in describing the FIG. 1 structure. Current is injected into the active layer from a current source $I_1$ via a transparent electrode 314 which makes electrical contact with a transparent metal film atop the ohmic contact layer 310. Similarly, a current is injected into the active layer in the tuning section by a current source $I_2$ via an electrode 318 (not necessarily transparent) which contacts a metal film 319 atop the ohmic contact layer. By varying the "tuning" current, the emission wavelength can altered by about 100 Angstroms. This results from the dependence of the refractive index of GaAs compounds on current flow.

Figure 5:
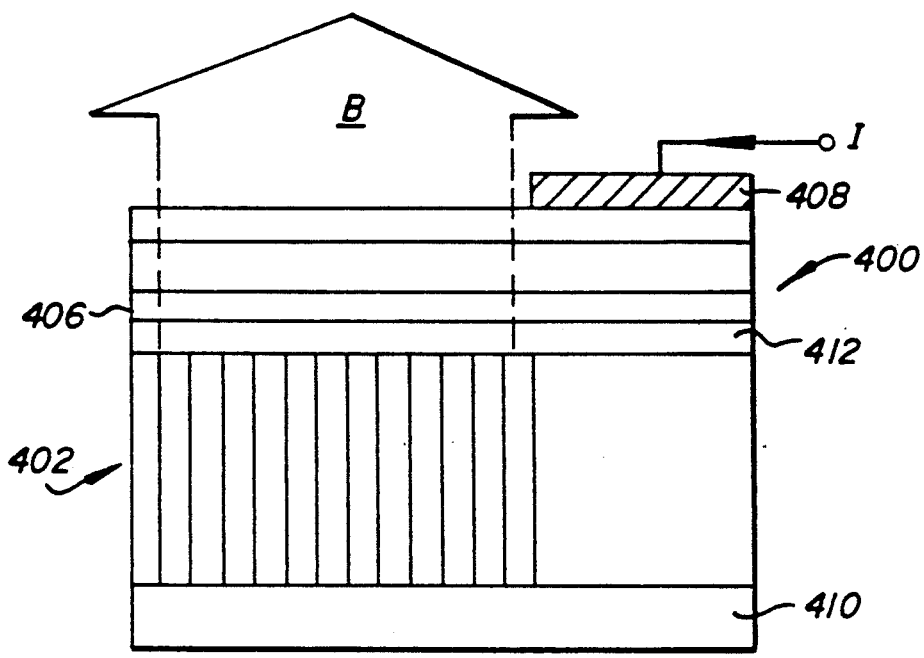
FIG. 5 is a cross-sectional illustration of a surface-emitting, distributed Bragg reflector (DBR) laser diode embodying the invention.

A distributed Bragg reflector (DBR) laser diode 400 embodying the invention is shown in FIG. 5. Again, a volume refractive index grating 402 composed of alternating thin layers of two different refractive index materials arranged perpendicular to the active layer is used to diffract a beam B of radiation perpendicular to the active layer 406. An electrode 408 coupled to a suitable current source I injects a laser action-stimulating current into the active layer. Here, the grating need not extend completely across the width of the device, and an n-type gallium-arsenide material may be disposed in the region between the substrate 410 and the SCH layer 412.

Figure 6A:
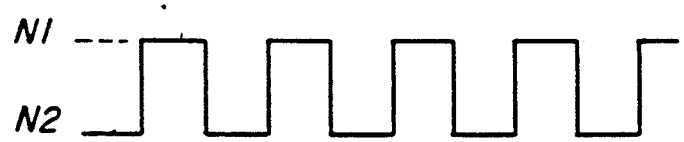
FIGS. 6A-6C illustrate different refractive index profiles attainable by a volume refractive index grating.
Figure 6B:
Figure 6C:

Referring to FIGS. 6A-6C, three different refractive index profiles are illustrated for the volume refractive index gratings described above. The FIG. 6A profile can be readily provided by simply maintaining the stoiciometry of alternate layers constant throughout the layer thickness. The sawtooth profiles, unblazed and blazed, illustrated in FIGS. 6B and 6C can be produced by varying the stoiciometry of the layers as they are grown (i.e. formed). The above-mentioned MOCVD process can be used to achieve these, and virtually any other, refractive index profiles. A process for producing the laser diode structures illustrated in FIGS. 3-5 is described below.

The use of MBE (molecular beam epitaxy) or MOCVD technology, allows for the growth of layers as fine as 10 angstroms in thickness. Thus, a very repeatable high quality refractive index grating can be formed by either of these technologies. The refractive index profile within each grating layer can be controlled by altering the composition of each layer as it is grown. The composition of each layer can easily be controlled by regulating the flow rate of each reactants' gas in an MOCVD reactor or by controlling the intensity of each beam in a MBE apparatus. This will allow the tailoring of the refractive index profile which can be utilized to control the amount of energy diffracted into the first and second diffraction orders. By forming a stack of alternating $Al_{(1-x)}Ga_xAs/Al_{(1-y)}Ga_yAs$ layers (also known as a quantum well superlattice), approximately 200 μm high, scribing and breaking the substrate into strips 200 μm wide and growing the active layer, cladding layer, etc. perpendicular to these layers, a high quality DFB or DBR laser can be fabricated with a high yield. The quality of the interface between the refractive index grating formed by the composition modulated superlattice and the separate confinement layer, active layer, cladding layer etc. will by very high since the surface produced by scribing and breaking the superlattice layer is smooth and the material grown over these layers will be smooth and have a low level of crystalline defects and current recombination centers. The layer smoothness can also be enhanced via etching or polishing of the scribed superlattice strips. In contrast with a relief-type diffraction grating, the material grown atop the grating does not have to fill in the valleys between the peaks associated with relief-type diffraction gratings.

Figure 7A:
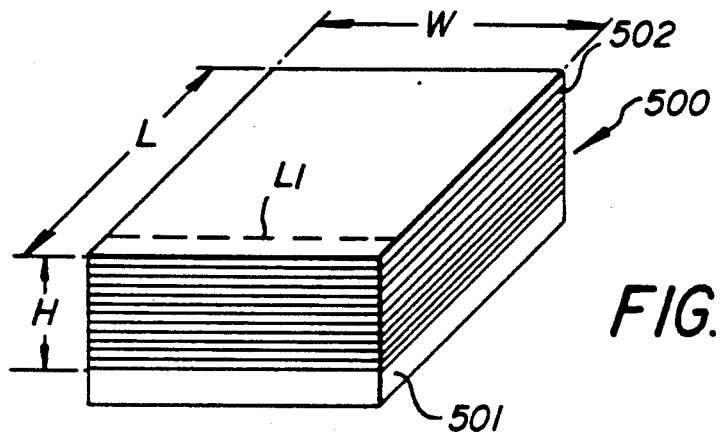
FIGS. 7A-7D illustrate a portion of a preferred manufacturing process for producing laser diodes embodying the present invention.
Figure 7B:
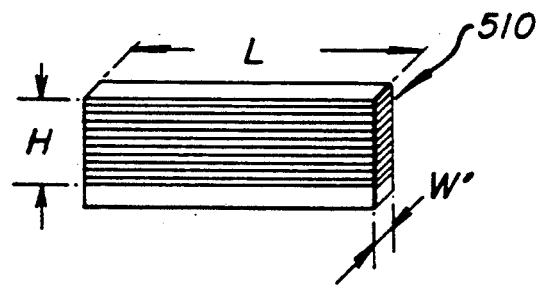

Referring to FIG. 7A, a superlattice wafer 500 having a length L and a width W, each dimension measuring 25 mm, is grown atop a gallium-arsenide substrate 501 to a total height H of 200 μm. The superlattice wafer comprises about 840 layers 502 which alternate in composition between $Al_{(1-x)}Ga_xAs$ and $Al_{(1-y)}Ga_yAs$, where x and y are chosen to provide a desired refractive index gradient between the adjacent layers. For example, as x approaches a value of zero, the refractive index approaches a value of about 2.97, whereas as y approaches a value of 1, the refractive index approaches a value of about 3.58. The 840 layers of the 200 micron high superlattice provide a grating pitch of 119 nm. Since MOCVD can grow layers at a rate of up to 30 microns in an hour, it will take approximately 7 hours to grow the superlattice wafer. The wafer is then cut along lines L1 to provide one hundred and twenty five bars 510 (shown in FIG. 7B), each being approximately 200 microns in width W, and each having a length L sufficient to make 125 lasers. Thus, each superlattice wafer can make as many as 15,625 laser diodes.

Figure 7C:
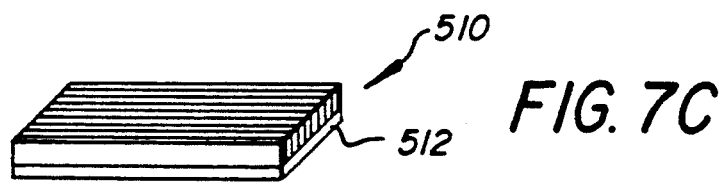
Figure 7D:
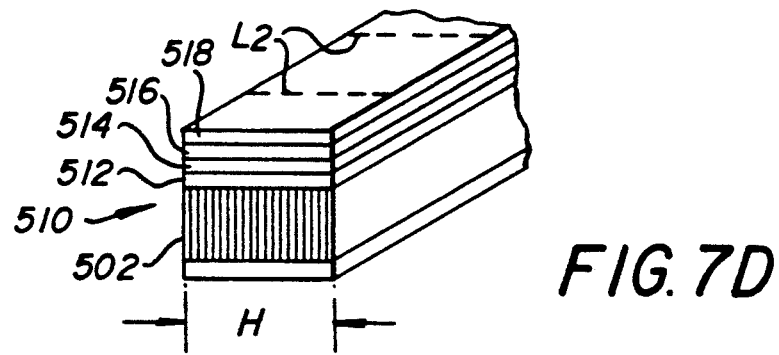

Referring to FIG. 7C, upon cutting the wafer to form bars 510, the substrate layer 501 is removed by polishing, and another GaAs substrate 512 is epataxially grown in a direction perpendicular to the edges of the multiple layers of bar 510. As shown in FIG. 7D, an SCH layer is epitaxially grown on the opposite of the bar, again perpendicular to the planes of layers 502 of the superlattice bar. A multiple quantum well active layer is then grown over the SCH layer. For example, the active layer can consist of 10 alternating layers each of $P-Al_{0.7}Ga_{0.3}As$ and $P-Al_{0.05}Ga_{0.95}As$ with thicknesses of 10 nm. The multiple quantum well active layer will reduce the threshold current, and decrease the sensitivity of the threshold current to temperature. A 10 nm cladding layer of $Al_{0.9}Ga_{0.1}As$ is grown over the multiple quantum well active layer to act as an optical waveguide and to cause the intensity distribution to overlap the refractive index grating to a greater extent. A layer of p+-GaAs is then grown to facilitate ohmic contacting. Thereafter, a thin Au-Cr layer is formed atop the ohmic contact layer, and a transparent electrode material (ITO) Indium Tin Oxide or (CTO) Cadmium Tin Oxide is formed atop the Au-Cr layer. The thickness of the transparent electrode is selected to be an odd multiple of a quarter-wave thickness so that it will act as an anti-reflection coating. The bar is then diced along lines L2 to provide multiple laser diode structures. Each laser diode is attached to a heatsink with the active layer up. A wire is then bonded to the transparent electrode (thin metal electrodes and ring electrodes can also be used).

The invention has been described in detail with particular reference to preferred embodiments. It will be appreciated that certain obvious modifications can be made without departing from the spirit of the invention, and such are intended to fall within the scope of the invention defined by the following claims.

What is claimed is:

1. In a surface-emitting, distributed feedback laser diode of the type comprising an active, semiconductive, planar waveguide and means for causing laser radiation to propagate therein, the improvement comprising:

a refractive index grating underlying said waveguide for causing laser radiation to be emitted in a direction substantially perpendicular to the plane of said waveguide, said refractive index grating comprising alternating layers of materials having different indices of refraction, said layers extending in a direction perpendicular to said waveguide.

2. The laser diode as defined by claim 1 wherein said waveguide comprises aluminum-gallium-arsenide compound, and wherein said materials comprise $Al_xGa_{1-x}As$, where $0.04 \leq x \leq 0.3$, and $Al_yGa_{1-y}As$, where $0.4 \leq y \leq 0.8$.

3. The laser diode as defined by claim 1 wherein said alternating layers have a uniform thickness of between 5 and 2500 Å.

4. The laser diode as defined by claim 3 wherein said alternating layers have a uniform thickness of between 1500 and 2500 Å.

5. The laser diode as defined by claim 3 wherein said alternating layers are formed, one layer at a time, by a vapor deposition process.

6. The laser diode as defined by claim 1 wherein said waveguide is spaced from said refractive index grating by a semiconductive buffer layer.

* * * * *